(12) United States Patent
Huott et al.

(10) Patent No.: US 6,978,408 B1
(45) Date of Patent: Dec. 20, 2005

(54) GENERATING ARRAY BIT-FAIL MAPS WITHOUT A TESTER USING ON-CHIP TRACE ARRAYS

(75) Inventors: William Vincent Huott, Holmes, NY (US); Norman Karl James, Liberty Hill, TX (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 11/008,797

(22) Filed: Dec. 9, 2004

(51) Int. Cl.[7] .............................................. G11C 29/00
(52) U.S. Cl. ..................... 714/723; 714/718; 714/726; 714/733; 714/42; 714/45; 365/201; 365/230.03; 365/156; 365/189.02
(58) Field of Search ............................. 714/40, 42, 45, 714/719, 723, 718, 726, 727, 733; 365/201, 365/230.03, 156, 154, 189.02, 189.05

(56) References Cited

U.S. PATENT DOCUMENTS

| | | | | |
|---|---|---|---|---|
| 4,924,466 A | * | 5/1990 | Gregor et al. | 714/2 |
| 5,794,175 A | * | 8/1998 | Conner | 702/119 |
| 6,832,342 B2 | * | 12/2004 | Fields et al. | 714/45 |

* cited by examiner

Primary Examiner—Andrew Q. Tran
(74) Attorney, Agent, or Firm—Duke W. Yee; Mark E. McBurney; Betty Formby

(57) ABSTRACT

An existing trace array on a chip is used to store the locations of bit failures from the automatic self-testing of an SRAM array. If a system is having problems, a technician can trigger the automatic test and then scan the trace array, thereby locating a large number of errors on the SRAM array very quickly.

21 Claims, 3 Drawing Sheets

GENERATING ARRAY BIT-FAIL MAPS WITHOUT A TESTER USING ON-CHIP TRACE ARRAYS

BACKGROUND OF THE INVENTION

1. Technical Field

This application relates to testing of static random access memory (SRAM). More specifically, the application relates to the use of existing on-chip arrays for testing of the SRAM, especially in the system environment.

2. Description of Related Art

SRAM, short for static random access memory, is a type of memory that is faster and more reliable than the more common DRAM (dynamic RAM). The term static is derived from the fact that the memory doesn't need to be refreshed like dynamic RAM. SRAM give a faster access time and a shorter cycle time, compared to DRAM, although it is more expensive. Due to its high cost, SRAM is often used only as a memory cache.

It is common for many chips made by International Business Machines, Inc. (IBM), such as microprocessor chips containing SRAM caches, to have an automatic built-in self-testing (ABIST) circuits. However, unless the chip is connected to the probes of an advanced testing engine (ATE), it is possible only to test to the first failure and then the test will stop for lack of a place to store information. Not only is the ATE an expensive machine (about a million dollars), but it is also not a device that can be taken into the field to test a customer's computer when problems develop. It would be desirable to have a method for testing the SRAM on the chip in the field.

SUMMARY OF THE INVENTION

The invention uses an existing trace array on the microprocessor chip to store the locations of bit failures from the automatic self-test of the SRAM array. If a system is having problems, a technician can trigger the automatic self-test and then scan the trace array, thereby locating a large number of errors on the SRAM array very quickly.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
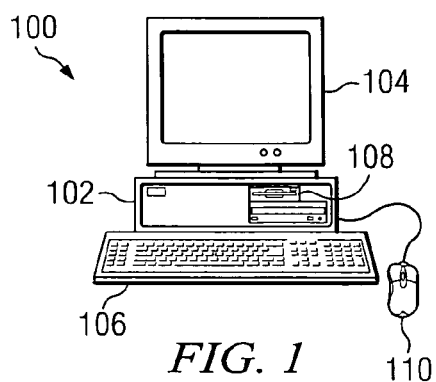
FIG. 1 depicts a data processing system in which a microprocessor chip containing SRAM memory can be installed according to an embodiment of the invention.

With reference now to the figures and in particular with reference to FIG. 1, a pictorial representation is shown of a data processing system in which a microprocessor chip containing SRAM memory can be implemented, in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

Figure 2:
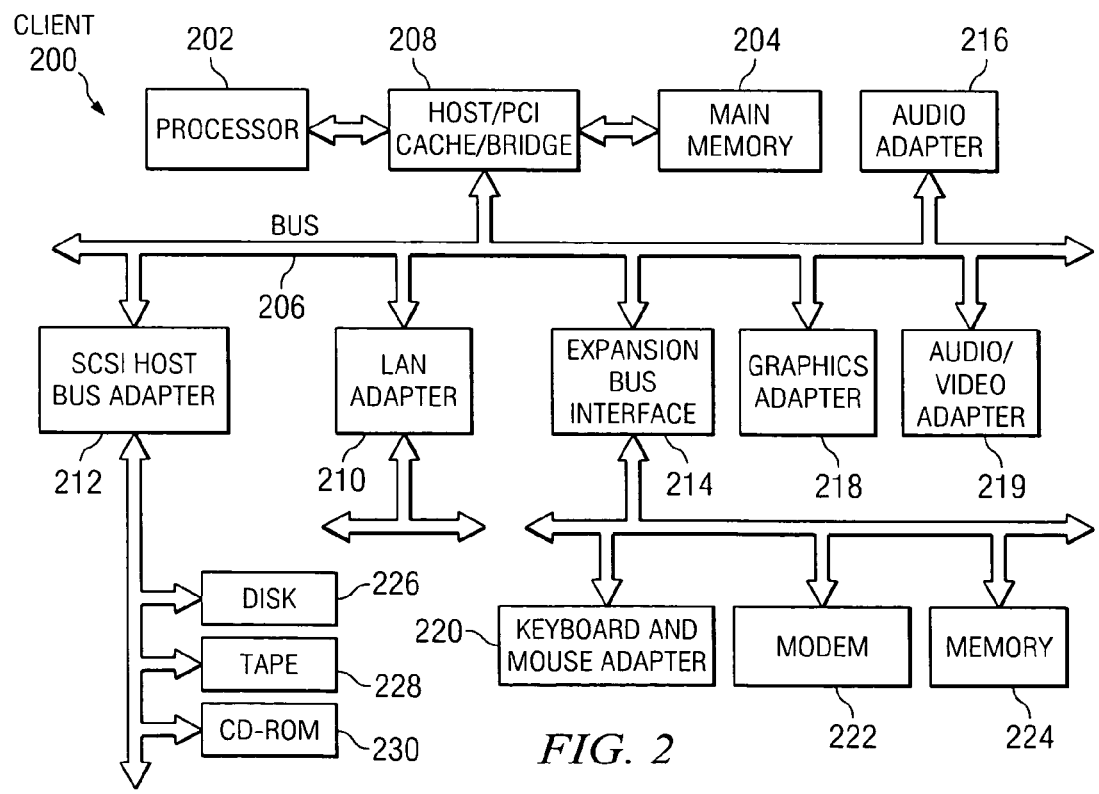
FIG. 2 depicts a block diagram of a data processing system in which a microprocessor chip containing SRAM memory can be installed according to an embodiment of the invention.

With reference now to FIG. 2, a block diagram of a data processing system is shown in which the present invention can be implemented. Data processing system 200 is an example of a computer, such as computer 100 in FIG. 1, in which a microprocessor chip containing SRAM memory according to the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in connectors. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and the above-described examples are not meant to imply architectural limitations. For example, data processing system 200 also may be a notebook computer or hand held computer in addition to taking the form of a PDA. Data processing system 200 also may be a kiosk or a Web appliance.

Figure 3:
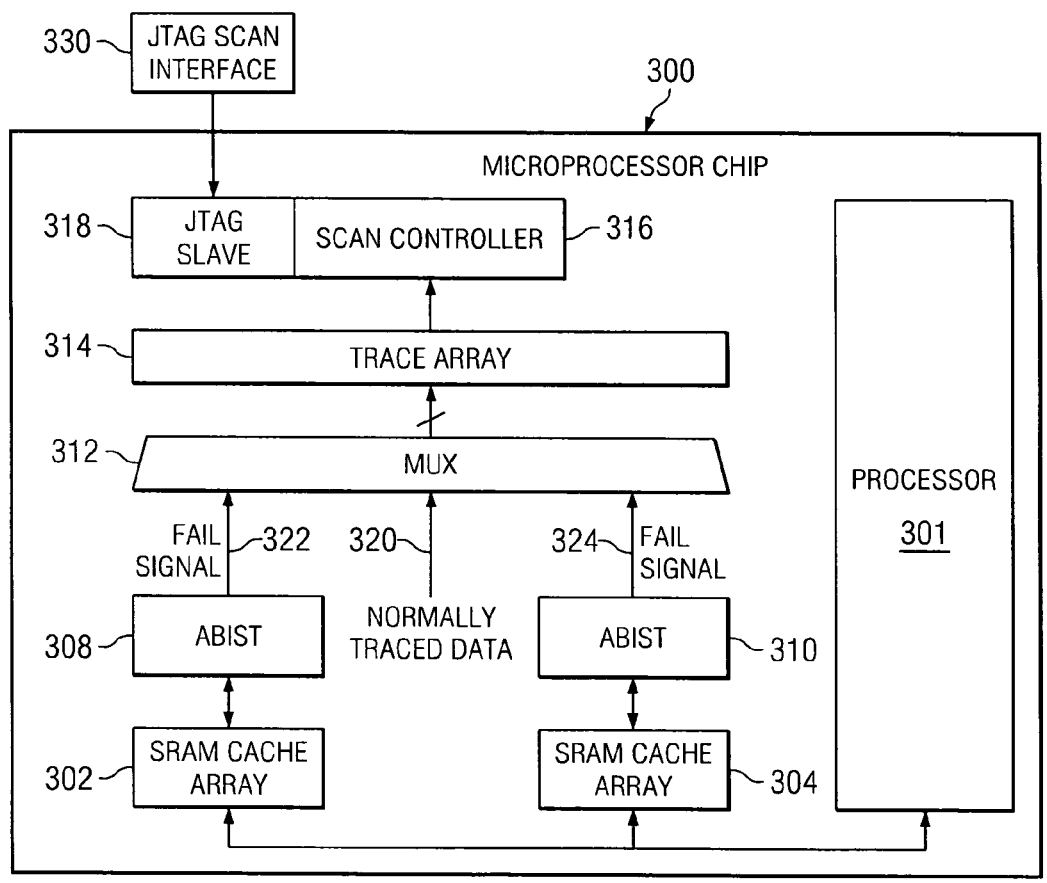
FIG. 3 depicts a block diagram of a portion of a microprocessor chip containing SRAM memory on which the present invention can be implemented.

FIG. 3 depicts a microprocessor chip 300. Chip 300 contains microprocessor circuitry 301, as well as SRAM cache arrays and associated circuitry, according to an exemplary embodiment of the invention. Two large SRAM cache arrays 302, 304 are connected to respective automatic, built-in self-testing circuits 308, 310. In this embodiment, each array has its own dedicated ABIST circuitry. Alternatively, each test circuit can test a number of arrays of SRAM cells, with circuits present to select an array to be tested. ABIST engines 308, 310 are designed to test the SRAM cells in a strict order, which does not vary. This allows the address of a failure to be calculated by knowing the number of computer cycles that have elapsed since the start of the test. The output of testing circuits 308, 310 are respective fail signals 322, 324, which are fed into multiplexor 312, along with an input from the normally traced data 320 of the prior art. Multiplexor 312 will forward a selected input signal to be stored in trace array 314. Typically, when a self-test is to be performed, a clock signal is sent to the trace array. From that point on, a signal is sent whenever a bit fails. When the fail signal is received, a count of the computer cycles since the last signal is recorded in trace array 314. Later, when trace array 314 is read, the cycle information is used to calculate addresses of bit failures. Trace array 314 can be read through the action of scan controller 316, which can itself be contacted through JTAG slave 318 from external JTAG scan interface 330.

Trace array 314 contains only a small amount of storage. In the exemplary embodiment above, trace array 314 contains space to store 256 bit failures. Therefore, if the number of failures goes above this number, the testing will be unable to record further failures and will be aborted.

JTAG is a standard for a testing architecture, originally developed by the Joint Test Action Group and later adopted by The Institute of Electrical and Electronics Engineers (IEEE) as the Standard Test Access Port and Boundary-Scan Architecture. This standard defines the chip access port as containing four required leads: (1) test mode select, (2) test clock input, (3) test data input, and (4) test data output, plus an optional lead: (5) test reset.

Figure 4:
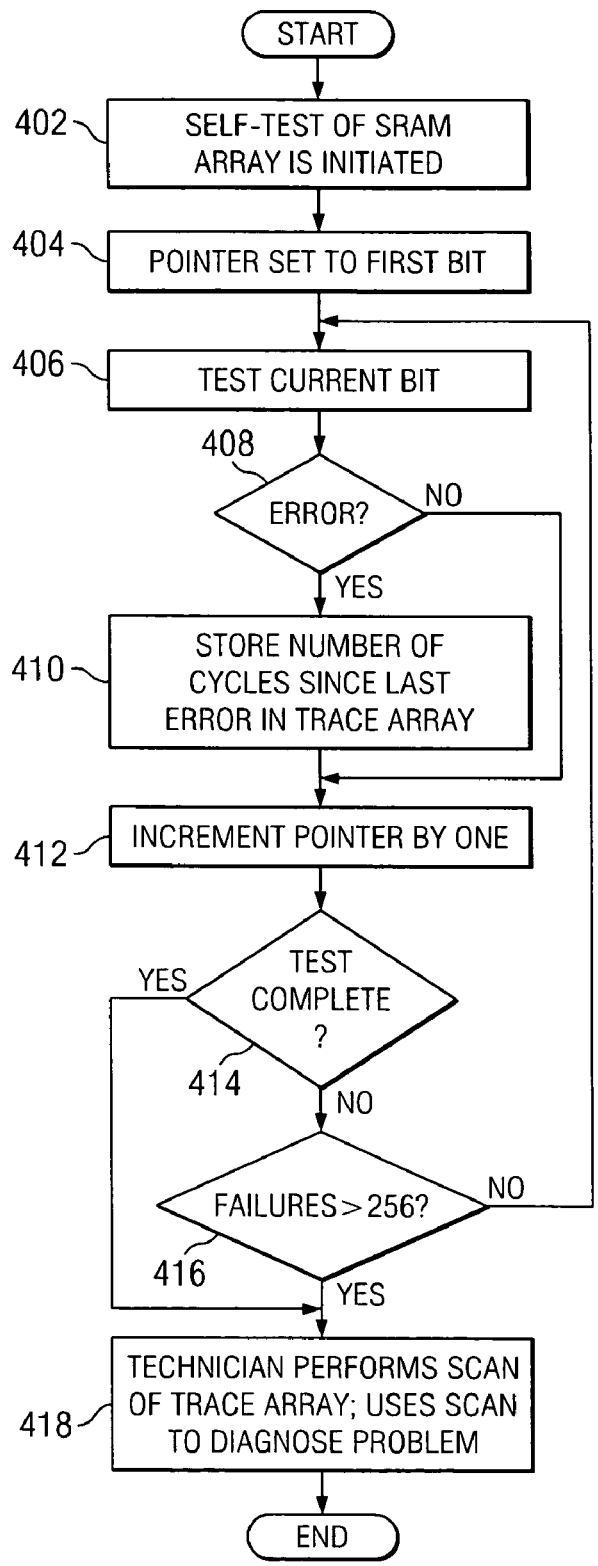
FIG. 4 depicts a flowchart showing the actions used to implement an exemplary embodiment of the invention.

FIG. 4 depicts a flowchart showing the actions used to test a chip, according to an exemplary embodiment of the invention. A signal to the test-mode-select pin on the chip triggers a self-test of the SRAM (step 402). When triggered, the ABIST circuit sets a pointer to point to the first bit to be tested and sends a start signal (step 404) over signal lines 322, 324. The ABIST circuit tests the current bit by writing a value to that bit, then reading the bit back (step 406). If an error occurs (step 408), i.e., the value read is not the same as the value written, the self-test circuit sends an error signal on a respective signal line 322, 324. At the trace array, a value, which indicates the number of cycles since the last signal, is saved in the next available location in the trace array (step 410). The pointer is then incremented by 1 to point to the next bit (step 412). A determination is made whether the test is completed, i.e., whether all cells have been checked (step 414). As mentioned above, the trace array has a limited number of locations for entries, e.g. 256; the number of errors found can be compared to this number (step 416). If the number of errors reaches the number of entries, there is no more storage space for errors, so the testing is completed. Otherwise, the testing continues until the entire array has been checked. When the self-test completes, a scan of the trace array is performed (step 440). As the values in the trace array are received, post-processing can be used to calculate the address when failures have occurred. The number of errors and the pattern of their locations can then be used as an aid in diagnosing problems with the chip. Given the capability to store self-testing information on the chips itself, a technician does not need to have the expensive testing equipment of the prior art in order to determine the incidence and pattern of memory errors, but can perform the test anywhere, such as at a customer site, greatly improving the flexibility of the testing capabilities.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for mapping bit failures in a memory array on an integrated circuit chip, said method comprising:
   performing a deterministic self-test of said memory array;
   when a bit in said memory array fails said self-test, storing an indicator, corresponding to a location of said bit, in an on-chip trace array;
   scanning said trace array and outputting respective indicators stored in said trace array; and
   from said indicators, determining locations in said memory array at which errors occurred.

2. The method of claim 1, wherein said performing step comprises:
   sending a first signal at the start of said self-test, and sending a second signal each time an error is detected.

3. The method of claim 2, wherein said storing step stores a number of computer cycles since either said first signal or one of said second signals was received.

4. The method of claim 3, wherein said determining step uses a cycle at which the error occurred and a knowledge of the order in which said self-test is performed to find the location at which the error occurred.

5. The method of claim 1, wherein said performing step comprises performing the following steps for each bit in said memory array:
   writing a first value to a current bit in said memory array,
   reading a second value from said current bit in said memory array, and
   determining that said current bit fails if said second value is not equal to said first value.

6. The method of claim 1, wherein said performing step comprises using a first automatic built-in self-testing circuit to check a first array and using a second automatic built-in self-testing circuit to check a second array.

7. The method of claim 1, wherein said method is performed at a user site.

8. An integrated-circuit chip, comprising:
   a first array of memory cells, each of said memory cells comprising a plurality of transistors;
   a first automatic, built-in self-test circuit connected to test said first array of memory cells;
   a trace array connected to receive the output of said first self-test circuit; and
   a scan controller connected to output values stored in said trace array.

9. The chip of claim 8, wherein said memory cells are static random access memory cells.

10. The chip of claim 8, wherein said trace array is connected to the output of said first self-test circuit through a multiplexor.

11. The chip of claim 8, wherein said first self-test circuit sends a first signal at the beginning of a test and sends a second signal whenever one of said memory cell fails.

12. The chip of claim 11, wherein said trace array is used to store a number of computer cycles since a last signal was received, wherein said last signal can be either said first signal or said second signal.

13. The chip of claim 8, wherein said first self-test circuit in configured to write a first value to a current memory cell in said first memory array, read a second value from said current memory cell, and determine that said current bit fails if said second value is not equal to said first value.

14. The chip of claim 8, further comprising a second automatic built-in self-testing circuit connected to test a second array of memory cells.

15. The chip of claim 8, further comprising pins connected to provide (a) test mode select, (b) test clock input, (c) test data input, and (d) test data output.

16. The chip of claim 8, further comprising a processor connected to utilize said memory array as cache memory.

17. A computer, comprising:
   a processor;
   a monitor connected to said processor;
   a keyboard connected to said processor;
   wherein said processor resides on an integrated-circuit chip that also contains
   an array of memory cells, each of said memory cells comprising a plurality of transistors;
   an automatic, built-in self-test circuit connected to test said array of memory cells;
   a trace array connected to receive the output of said self-test circuit; and
   a scan controller connected to output values stored in said trace array.

18. The computer of claim 17, wherein said array of memory cells is a static random access memory.

19. The computer of claim 17, wherein said trace array is connected to the output of said self-test circuit through a multiplexor.

20. The computer of claim 17, wherein said self-test circuit sends a first signal at the beginning of a test and sends a second signal whenever one of said array of memory cells fails.

21. The computer of claim 20, wherein said trace array is used to store a number of computer cycles since a last signal was received, wherein said last signal can be either said first signal or said second signal.

* * * * *